US008633456B2

(12) United States Patent
Buijsse et al.

(10) Patent No.: US 8,633,456 B2
(45) Date of Patent: Jan. 21, 2014

(54) METHOD FOR CENTERING AN OPTICAL ELEMENT IN A TEM COMPRISING A CONTRAST ENHANCING ELEMENT (75) Inventors: Bart Buijsse, Eindhoven (NL); Peter Christiaan Tiemeijer, Eindhoven (NL); Martinus Petrus Maria Bierhoff, Deurne (NL)

(73) Assignee: FEI Company, Hillsboro, OR (US)

( * ) Notice: Subject to any disclaimer, the term of this patent is extended or adjusted under 35 U.S.C. 154(b) by 174 days.

(21) Appl. No.: 13/367,251

(22) Filed: Feb. 6, 2012

(65) Prior Publication Data

US 2012/0199756 A1    Aug. 9, 2012

Related U.S. Application Data (60) Provisional application No. 61/440,113, filed on Feb. 7, 2011.

(30) Foreign Application Priority Data

Feb. 7, 2011  (EP) .................................. 11153513

(51) Int. Cl.
G01J 1/00   (2006.01)
G01N 21/00  (2006.01)
G01N 23/00  (2006.01)

(52) U.S. Cl.
USPC ........ 250/491.1; 250/306; 250/307; 250/311; 250/396 R (58) Field of Classification Search
USPC ....... 250/306, 307, 311, 396 R, 491.1; 850/8, 850/9
See application file for complete search history.

(56) References Cited

U.S. PATENT DOCUMENTS

| 5,814,815 | A | * | 9/1998 | Matsumoto et al. | ........... 250/311 |
| 6,744,048 | B2 | * | 6/2004 | Hosokawa et al. | ........... 250/311 |
| 7,737,412 | B2 | * | 6/2010 | Jin et al. | .................... 250/396 R |
| 7,915,584 | B2 | * | 3/2011 | Tiemeijer et al. | ............. 250/310 |
| 8,071,954 | B2 | * | 12/2011 | Wagner et al. | ............. 250/396 R |
| 8,299,442 | B2 | | 10/2012 | Benner | |
| 8,405,027 | B2 | | 3/2013 | Lazar et al. | |
| 2011/0315876 | A1 | | 12/2011 | Buijsse et al. | |
| 2013/0193322 | A1 | * | 8/2013 | Blackburn | .................... 250/311 |

FOREIGN PATENT DOCUMENTS

WO    WO03068399    8/2003

OTHER PUBLICATIONS

Nagayama, Kuniaki, et al., 'Phase Contrast Enhancement with Phase Plates in Biological Electron Microscopy,' Microscopy Today, Jul. 2010, pp. 10-13, vol. 18, No. 4.

(Continued)

Primary Examiner — Jack Berman
Assistant Examiner — Meenakshi Sahu
(74) Attorney, Agent, or Firm — Scheinberg & Associates, PC; Michael O. Scheinberg; John B. Kelly (57) ABSTRACT A method for adjusting or aligning one or more optical elements in a Transmission Electron Microscope (TEM) is disclosed. The TEM is equipped with an objective lens for guiding a beam of electrons to a sample, a diffraction plane in which at least a beam of unscattered electrons is focused and a structure to enhance the Contrast Transfer Function (CTF) which is situated in the diffraction plane or an image thereof.

20 Claims, 8 Drawing Sheets (56) References Cited

OTHER PUBLICATIONS

Danev, Radostin, et al., "Practical Factors Affecting the Performance of a Thin-Film Phase Plate for Transmission Electron Microscopy," Ultramicroscopy, Mar. 1, 2009, pp. 312-325, vol. 109.

Danev, Radostin, et al., "Transmission Electron Microscopy with Zernike Phase Plate," Ultramicroscopy, Sep. 1, 2001, pp. 243-252, vol. 88, No. 4.

* cited by examiner

METHOD FOR CENTERING AN OPTICAL ELEMENT IN A TEM COMPRISING A CONTRAST ENHANCING ELEMENT

This Application claims priority from U.S. Provisional Application 61/440,113, filed Feb. 7, 2011, which is hereby incorporated by reference.

TECHNICAL FIELD OF THE INVENTION

The invention relates to a method for adjusting or aligning one or more optical elements in a Transmission Electron Microscope (TEM).

BACKGROUND OF THE INVENTION

Such a method is known from U.S. Pat. No. 6,744,048. This patent relates to aligning a phase plate in a TEM. In a TEM a beam of energetic electrons irradiates a thin sample. Preferably the beam is a parallel beam. The sample is so thin (typically between 25 nm and 250 nm), that most electrons pass through it unaffected, but some electrons are absorbed or scattered. In the diffraction plane (coincident with the back-focal plane of the objective lens when a parallel beam irradiates the sample) the electrons that passed the sample unhindered are all focused in one point. Scattered electrons are focused in other points in this diffraction plane.

The diffracted electrons form a phase image by destructive or constructive interference with the undiffracted electrons. A problem of said imaging method is that for low spatial frequencies the Contrast Transfer Function (CTF) shows a minimum, and thus the contrast of large structures is low.

The image can be enhanced by inserting a phase plate in the diffraction plane, the phase plate inducing a phase difference between the central, undiffracted beam and the diffracted electrons. Preferably the phase shift introduced is $+\pi/2$ or $-\pi/2$, thereby changing the sinusoidal behavior of the CTF to a cosinusoidal behavior.

The above is discussed and illustrated in, for example, "Phase contrast enhancement with phase plates in biological electron microscopy", K. Nagayama et al., Microscopy Today, Vol 18 No 4, 2010, pp. 10-13.

The phase plate used by Nagayama, co-author of the known U.S. Pat. No. 6,744,048, is a so-called Zernike phase plate consisting of a thin carbon foil. The foil causes an electron beam passing through the foil to experience a phase shift of $-\pi/2$. For 300 keV electrons the thickness of the carbon foil should thus be approximately 24 nm. The foil shows a central hole with a diameter of 1 μm, or even 0.5 μm, through which the undiffracted beam passes. It is noted that the diameter of the central beam (the focus in which all undiffracted electrons are focused) in the diffraction plane is approximately 20 nm. The accuracy with which the phase plate must be aligned is thus better than +/−0.5 μm or even better than +/−0.25 μm.

The patent discusses the problems associated with mechanical alignment of the phase plate to the required accuracy, and proposes to use electro-magnetic alignment with coils to centre the phase plate.

Obviously the phase plate can, during the alignment, intercept the central beam. As this beam comprises most of the current with which the sample is irradiated, and the focus has a small diameter, both the current and the current density are high. The phase plate may thus be damaged due to thermal heating, and also contamination may occur, said contamination giving rise to charging when irradiated. Also beam induced oxidation may result in charging. Nowadays also TEM's become available in which the sample resides in a volume in which gasses are introduced. This is done to study micro-chemistry effects etc. The result of the higher gas pressure at the sample is that often also the pressure at, for example, the position of the phase plate is higher. This may give rise to surface oxidation of the phase plate structure, and thus to charging.

It is noted that such damaging or contamination problems may also occur when other optical elements upstream of the phase plate (upstream meaning between electron source and the phase plate) are aligned, as this may cause a shift of the image in the diffraction plane. Examples of such optical elements are deflectors, lenses and apertures positioned between electron source and the phase plate.

It is further noted that similar damage and/or contamination may occur for other phase enhancement structures, such as the knife edge used in Single Sideband Imaging, or in the so-named "tulip device" described in European Patent application EP10167258 (acting as a Single Sideband imaging device for a selected spatial frequency range), the miniature electrostatic miniature lens (see e.g. U.S. Pat. No. 5,814,815), or the phase shift element disclosed in U.S. Pat. No. 7,737,412, as all these structures must be extend to a position close to the central beam.

Accordingly, there is a need for an improved method of centering optical elements while avoiding damage or charging of the structure to enhance the Contrast Transfer Function.

SUMMARY OF THE INVENTION

The invention relates to a method for adjusting or aligning one or more optical elements in a Transmission Electron Microscope. The TEM equipped with an objective lens for guiding a beam of electrons to a sample shows a diffraction plane in which at least a beam of unscattered electrons is focused. The TEM is equipped with a structure to enhance the Contrast Transfer Function which is situated in the diffraction plane or an image thereof while irradiation with unscattered electrons of the structure during the adjusting or aligning is prevented by deflecting the beam of unscattered away from the structure.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

In accordance with some embodiments of the invention, a method for adjusting or aligning one or more optical elements in a TEM comprises preventing irradiation with unscattered electrons of the structure to enhance the CTF during the adjusting or aligning process by deflecting the beam of unscattered electrons away from the structure.

By deflecting the beam away from the structure, the structure is not irradiated, and thus charging, contamination and/or damage of the structure is prevented. It is noted that this may result in the irradiation of parts removed from the axis, but this is in most cases of less importance, as any contamination on these remote places intercept during normal use less electrons, and thus less charging occurs. A correction for some additional astigmatism is usually sufficient to eliminate the effect of charging of an aperture edge.

In some embodiments, the structure is a phase plate or a single sideband imaging device. Phase plates are known for their use to enhance the contrast of images, more specific their enhancement at low spatial frequencies (large structures). What the different types of phase plates have in common is that, in normal operation, they extend to very close to the undiffracted focused beam, typically to less than 5 µm, more preferably less than 1 µm. On the axis the beam of undiffracted electrons is focused. The phase plate thus extends to a spot with large current. Any charging will cause deflection of said spot, and lead to a deterioration of the image.

Also single sideband imaging devices, such as the Foucault knife edge or the Hilbert knife edge described in earlier mentioned "Phase contrast enhancement with phase plates in biological electron microscopy" by Nagayama extend to a position close to the axis. That these devices by definition are asymmetric with respect to the axis makes it even worse.

It is further mentioned that most of these structures are quite delicate, and heating of the structures by irradiating them with a focused beam of electrons may damage the structure.

It is noted that the earlier mentioned "tulip-device" is also such a structure.

In some embodiments of the invention, the structure (for example a phase plate or a single side band device) is not positioned in the diffraction plane (at or near the so-called back-focal plane of the objective lens), but in an image thereof.

It is already known to place such devices in an image of the diffraction plane, preferably in an enlarged image. This eases the demands on size and centering of the device with respect to the axis.

In some embodiments of the invention, the structure is located round an optical axis, the beam is bent away from the optical axis to prevent irradiation of the structure, and the beam is bent back onto the axis and aligned to the axis using one or more deflectors and/or lenses.

When centering an optical device, it is often required that an image is made on the detectors at the end of the apparatus (downstream of the image enhancing device). Such detectors may be a CCD camera, a CMOS camera, a fluorescent screen, a so-called Post Column Filter, etc. To image a beam that is deflected from the axis on such a detector, the beam should be brought back to the axis and aligned with the axis. As known to the person skilled in the art a beam can be brought back to the axis using deflectors, but also with a lens. To align the beam to the axis (making it parallel to the axis) deflectors should be used.

In some embodiments of the invention, the structure is part of or mounted on a holder, the position of the structure with respect to the holder known, and the structure centered by positioning one or more features of the holder.

When the optical element to be centered is the phase enhancing structure itself, it seems that this cannot be done without irradiation the structure. However, if the position of the structure with respect to features on a holder holding the structure, it suffices when the features are positioned. Such features can be transparent parts in the holder, or part on the holder showing, for example, a secondary electron coefficient different from other parts of the holder.

It is noted that the position of the structure with respect to the one or more features can be determined by making, for example, a shadow image of structure and features at low current density.

In a preferred embodiment of the invention the holder shows a circular hole, the center of the circular hole coinciding with the structure, and the feature is the rim of the circular hole Placing a phase plate or a single side band device in a (circular) aperture is well known. The phase plate may be a MEMs device, formed in a semiconductor manufacturing process. The centering of such a device within the aperture is often very good. By then centering the rim of the aperture, the device itself is centered as well.

In some embodiments of the invention, the diffraction plane coincides with the back-focal plane of the objective lens.

Although the diffraction plane and the back-focal plane of the objective lens need not coincide (this occurs when the beam irradiating the sample is not a parallel beam), it is preferred when the irradiating beam is a parallel beam and the diffraction plane and the back-focal plane thus coincide.

Figure 1A:
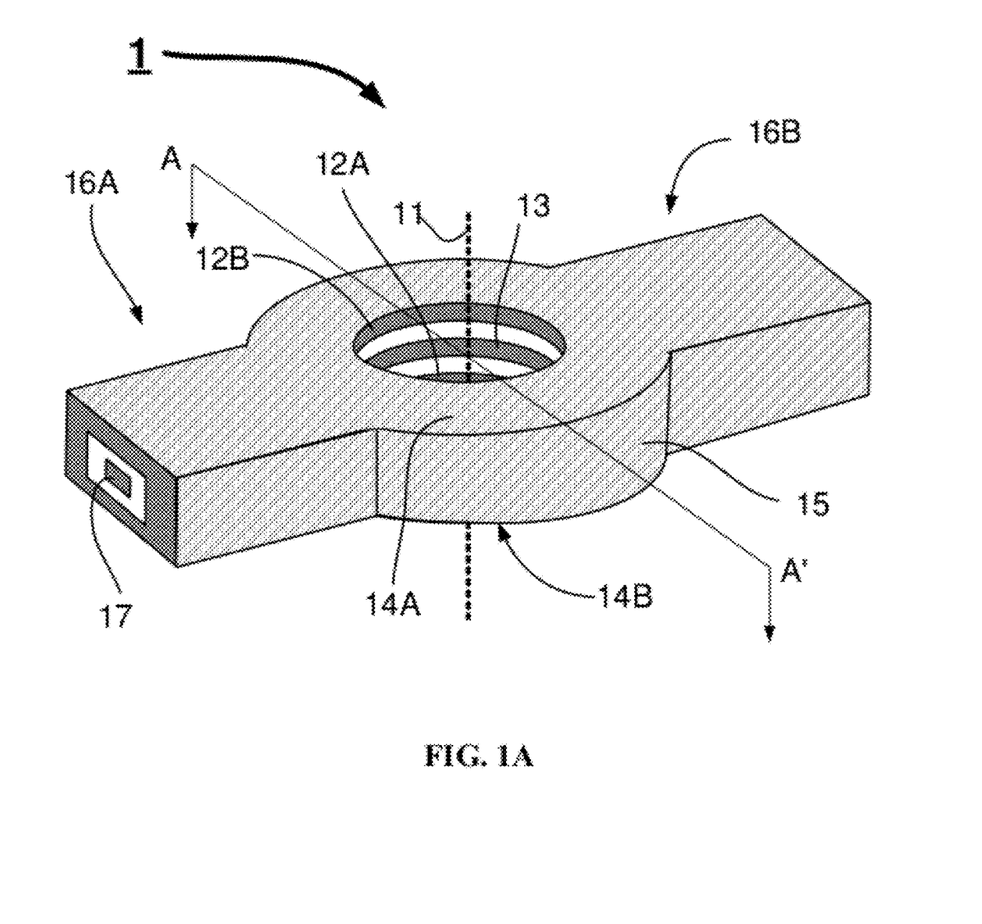
FIG. 1A is a schematic view of a Boersch phase plate.
Figure 1B:
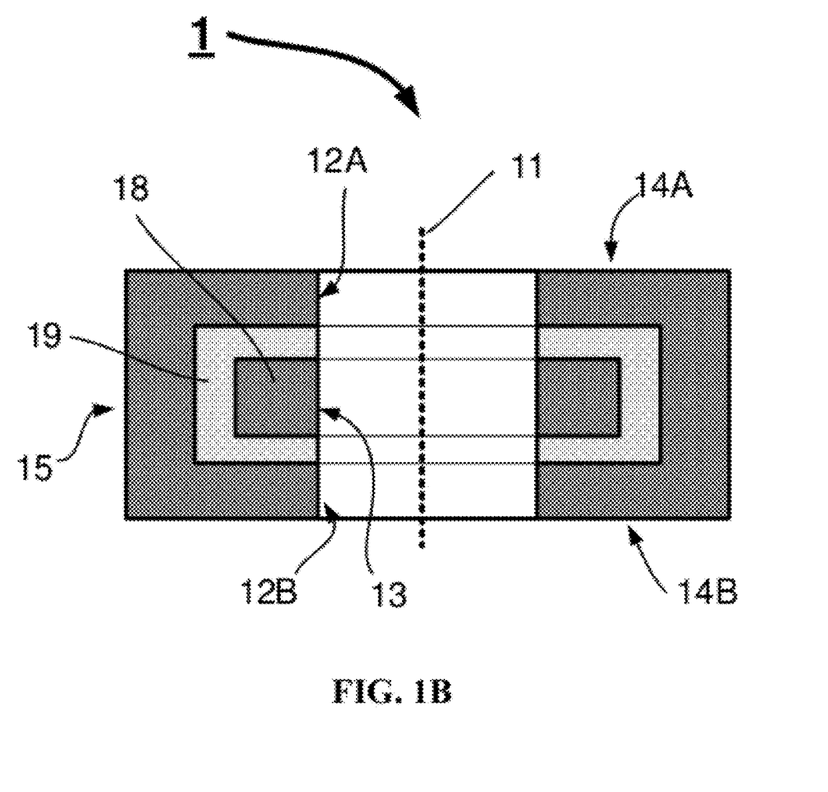
FIG. 1B is a cross-sectional schematic view of a Boersch phase plate.

FIG. 1A schematically shows a Boersch phase plate as described in e.g. U.S. Pat. No. 5,814,815, and FIG. 1B schematically shows a cross-section of the phase plate of FIG. 1A along line AA'.

A central structure in the form of a cylinder is shown with a bore along an axis 11, the inside of the bore showing three ring-shaped electrodes 12A, 12B and 13 arranged round the axis of the cylinder. The middle electrode 13 is insulated from the two outer electrodes 12A and 12B by insulating material 19, while the two outer electrodes are electrically connected to each other. The conductive outer surface comprising surfaces 14A, 14B and 15 of the cylinder is formed by a conductive surface, the outer electrodes 12A, 12B part of said conductive outer surface. This conductive outer surface is electrically connected to earth.

From the phase plate two spokes 16A, 16B extend to hold the phase plate in a holder (not shown). The outside of the spokes shows an electrically conductive layer connected to the conductive outer surface of the cylinder. At least one of the spokes shows an inner conductive track 17 insulated from the outer layer, the inner track electrically connected to the middle electrode 13. It is noted that phase plates with only one spoke are known, as well as phase plates with 2 and 3 spokes.

By applying a voltage to the middle electrode electrons of the unscattered beam (passing through the bore) will travel slower or faster (depending on the polarity of the voltage of the middle electrode) than electrons travelling outside the cylinder. This is equivalent to applying a phase shift to the unscattered part of the beam with respect to the scattered part of the beam, as the scattered part of the beam is unaffected by the voltage of the middle electrode.

The actual phase shift depends on the energy of the electrons and the voltage on the middle electrode. By proper choice of the voltage a phase shift of $\pi/2$ or $-\pi/2$ is applied to the central beam.

The conductive outer layer surrounds the cylinder so as to cause a uniform phase shift between the unscattered electrons and the scattered electrons. The conductive layer confines the effect of the middle electrode 13 to the unscattered beam, and prevents an electric field outside the cylinder due to the voltage on middle electrode 13. Therefore any electrons passing outside the cylinder do not experience a phase shift.

Figure 2A:
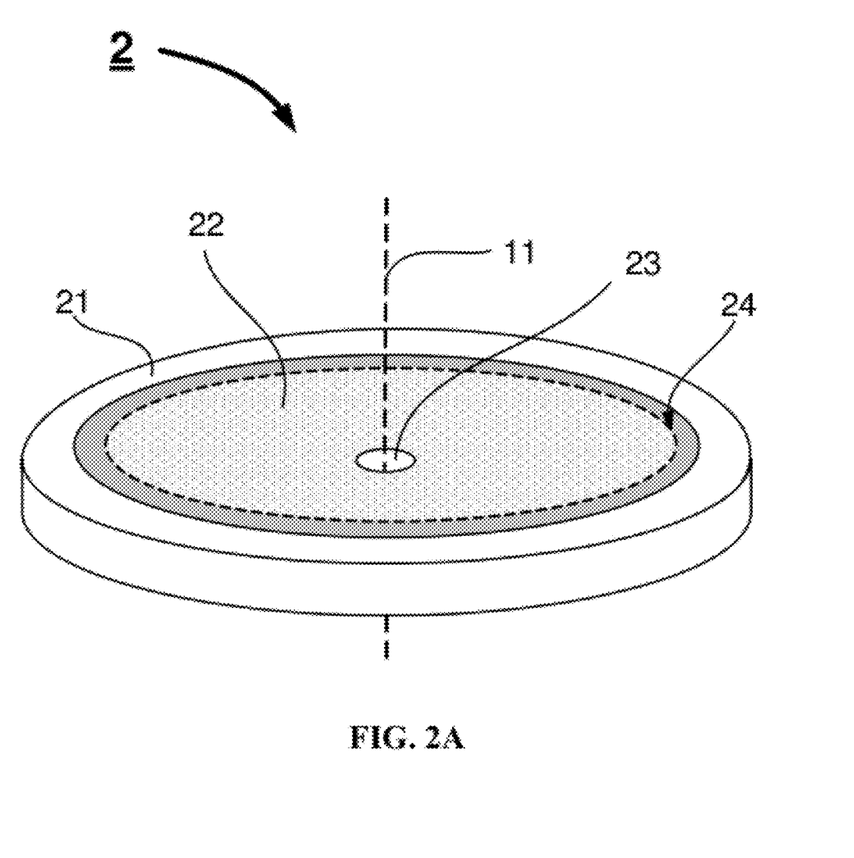
FIG. 2A is a schematic view of a Zernike phase plate.
Figure 2B:
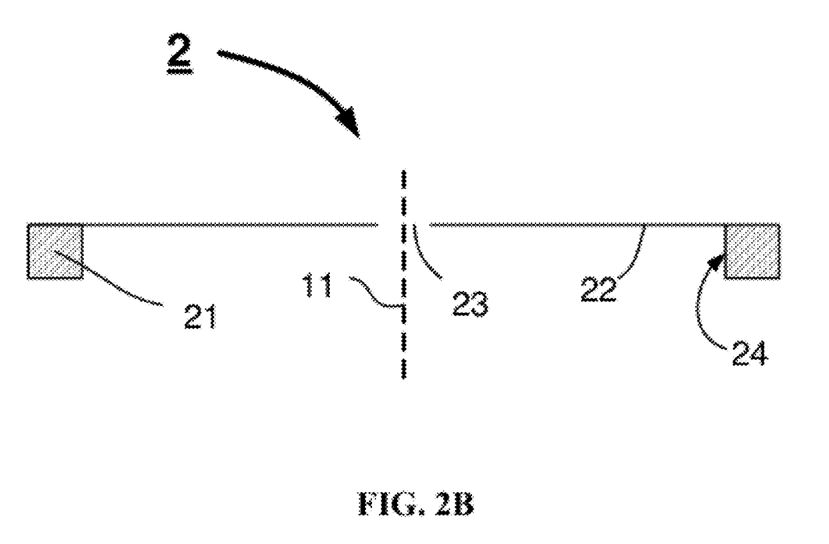
FIG. 2B is a cross-sectional schematic view of a Zernike phase plate.

FIG. 2A schematically shows a Zernike phase plate, while FIG. 2B schematically shows a cross-section of the phase plate shown in FIG. 2A.

A carbon foil 22 is attached to a carrier 21, such as a standard platinum aperture. The carrier shows an circular inner wall 24, and the carbon foil extends slightly beyond this inner wall. The carbon foil shows an aperture 23 for passing the unscattered electrons. All other electrons, that is: all scattered electrons which contribute to the image, pass through the foil. By passing the foil these electrons experience a phase shift. The actual phase shift depends on the energy of the electrons and the thickness of the foil. By proper choice of the thickness a phase shift of $-\pi/2$ is realized. For 300 keV electrons a thickness of approximately 28 nm results in a phase shift of $\pi/2$.

It is noted that the phase shift caused by a Zernike phase plate, contrary to the phase shift caused by a Boersch phase plate, cannot be tuned. Therefore a Zernike phase plate may show the optimal phase shift needed for a 200 keV electron beam, but not for a 300 keV beam.

It is further noted that using a Zernike phase plate typically 30% or more of the electrons are absorbed or scattered by the foil, thereby reducing the CTF by 16% or more. This especially impacts the high resolution performance of the TEM, limited by the signal-to-noise ratio.

A detailed analysis of the properties of Zernike phase plates and of CTF of phase plates in general is given in "Transmission electron microscopy with Zernike phase plate", R. Danev and K. Nagayama, Ultramicroscopy 88 (2001) 243-252.

Figure 3:
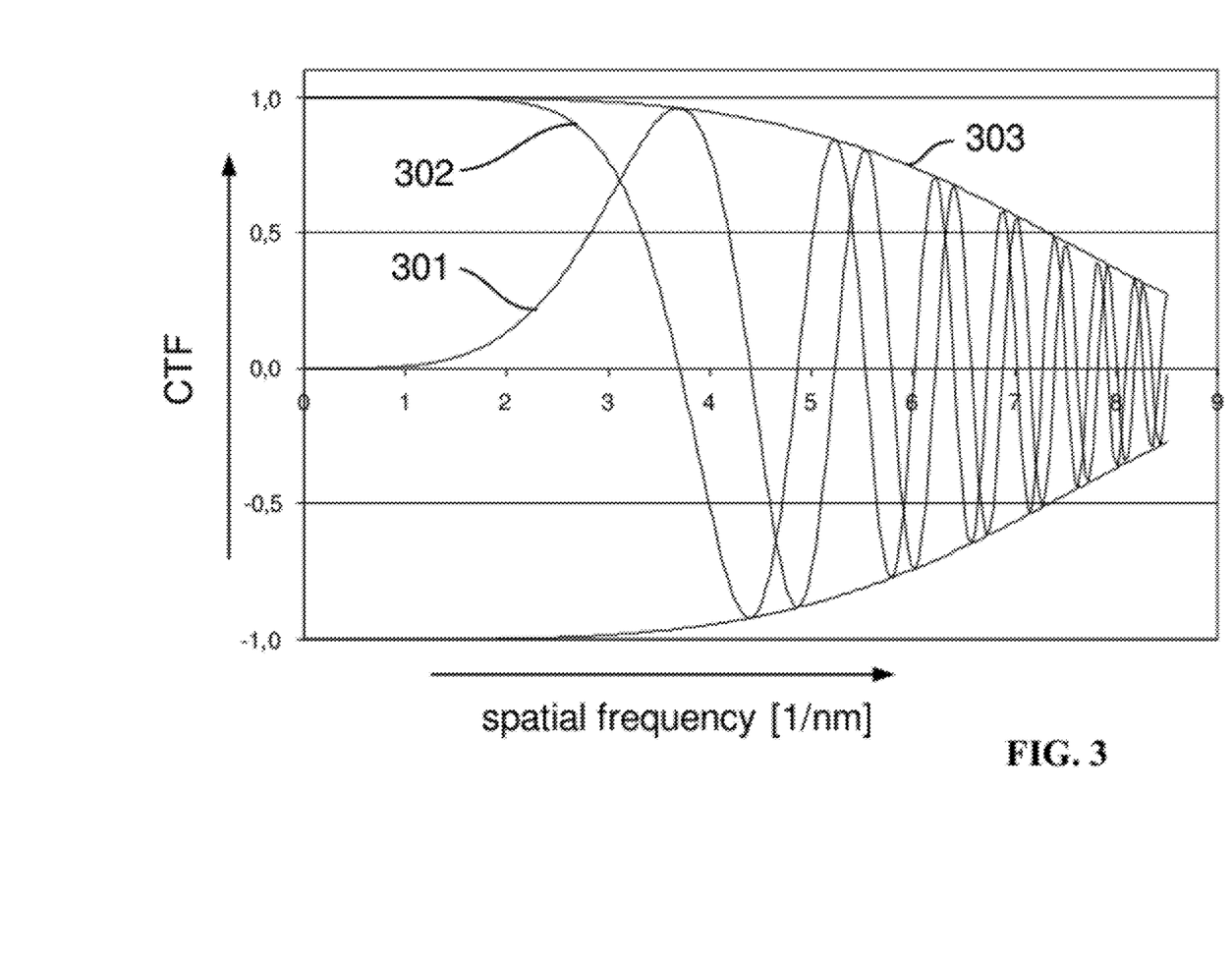
FIG. 3 is a schematic view of the Contrast Transfer Function of a Boersch phase plate.

FIG. 3 schematically shows the "in-focal" Contrast Transfer Function (CTF) of a TEM with the phase plate of FIG. 1A, as well as the CTF of a conventional TEM.

A theoretical treatment of the CTF is given in earlier mentioned "Transmission electron microscopy with Zernike phase plate", specifically §2 and the appendix A. In its FIG. 2 the CTF of a conventional TEM and a TEM with phase plate is shown, albeit that in that figure the so-named "envelope function" is disregarded. The envelope function is the function that describes the loss of transfer function at high frequency.

FIG. 3 shows the CTF 301 of a conventional TEM (without phase enhancing structure) and the CTF 302 of a TEM with a Boersch plate in focus. Both CTF's are cropped by the envelope function 303 which is a function of the optical quality of the TEM and the source brightness.

As is clearly visible in FIG. 3, the CTF of a conventional TEM is for low spatial frequencies (in this case: between 0 and 1 per nm, corresponding with structures larger than 1 nm) approaches zero. For the phase corrected TEM however, the CTF shows a maximum in this frequency band. The trade-off is at higher frequencies, where the CTF shows oscillations. Here the maximum of one CTF may coincide with a minimum of the other, or vice versa.

It is noted that a Zernike phase plate shows a CTF comparable to curve 302, but then scaled by a factor of 0.84 to account for the earlier mentioned scattering of the carbon film.

It is further noted that for very low frequencies the diffracted electrons are intercepted by the structure, or pass through the hole together with the undiffracted beam. Therefore at very low frequencies the CTF drops to zero.

It is mentioned that the CTF shows a different transfer when the sample is not in focus, as shown in FIG. 2 of the article earlier mentioned. This may extend the usable range of the CTF.

For this reason the so-named Scherzer focus is often used as the optimal setting of the (de)focus condition of the objective lens in conventional TEMs.

Figure 4:
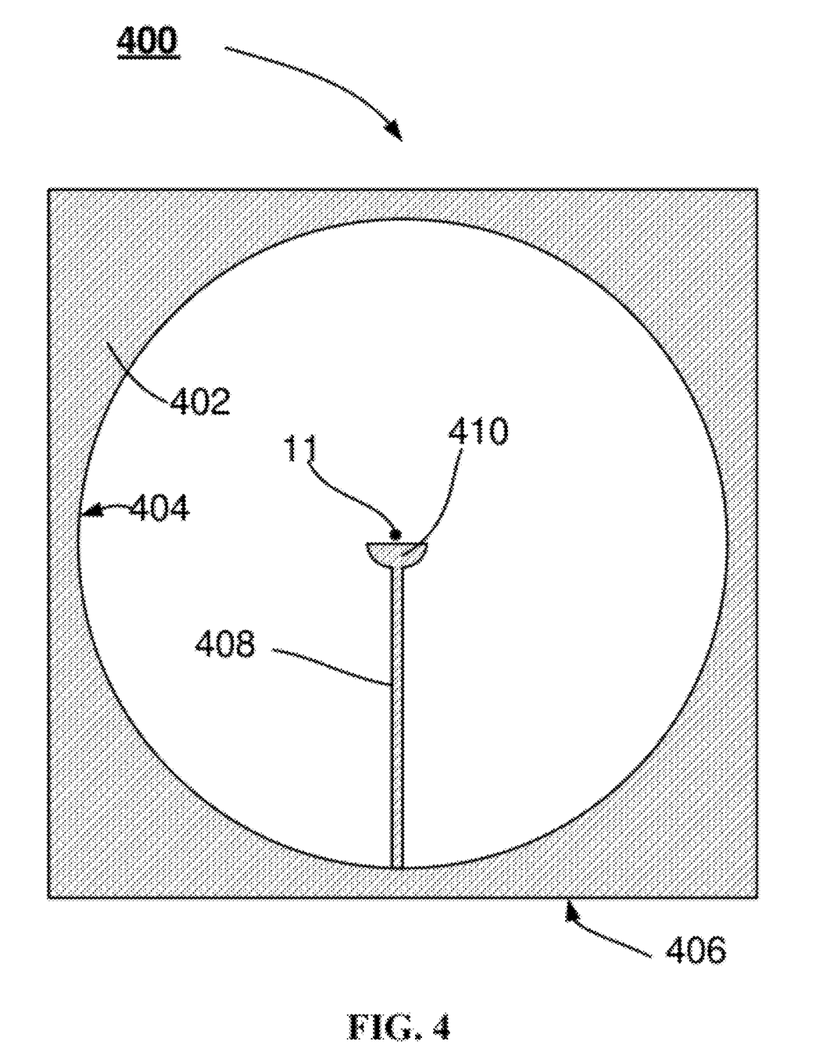
FIG. 4 is a schematic view of rays in the diffraction plane of a TEM with a phase plate.

FIG. 4 shows a holder 402 sometimes called a "tulip" device, made of for example silicon, showing an outer rim 406 and a circular inner rim 404. Extruding from the inner rim a stem 408 protrudes to the center of the inner rim, where a semicircular structure 410 blocks part of the scattered electrons. The undiffracted beam passes along axis 11 the structure 410. Typical dimensions are a width of the stem of 1 µm and a radius of structure 410 of 6 µm. The radius of circular rim 404 is typically in the order of 50 um.

The outer rim 406 is preferably clamped in a holder for positioning the tulip. The tulip itself is formed by, for example, a photolithographic process, and is centered with respect to the circular inner rim 404.

Figure 5:
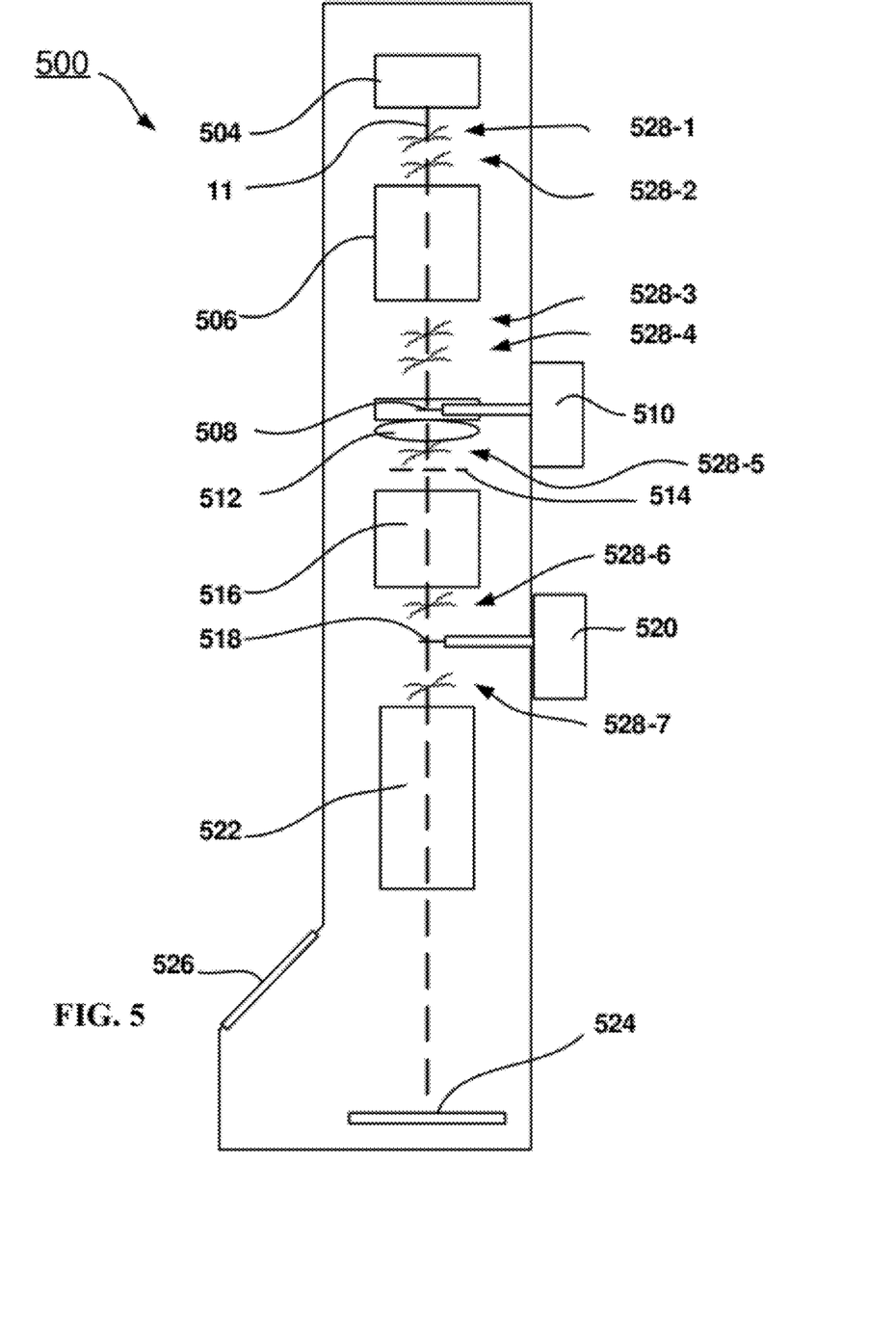
FIG. 5 is a schematic view of a TEM according to the invention.

FIG. 5 shows a particle source 504 producing a beam of particles, such as electrons, along optical axis 11. The particles have a typical energy of 80-300 keV, although higher energies, e.g. 400 keV-1 MeV, or lower energies, e.g. 50 keV, may be used. The beam of particles is manipulated by condenser system 506 to form a parallel beam impinging on a sample 508, the sample positioned with a sample holder 510. The sample holder can position the sample with respect to the optical axis and may shift the sample in the plane perpendicular to the optical axis and tilt the sample with respect to said axis. Objective lens 512 forms a magnified image of the sample. The objective is followed by a magnifying system 516, e.g. a doublet of lenses, forming an enlarged image of the back-focal plane 514 of the objective lens. A phase plate 518 is placed in the enlarged image of the back-focal plane of the objective lens, this conjugated plane positioned between the magnifying system and a projection system 522. The magnifying system 522 thus forms an image of the back-focal plane with a variable magnification. The phase plate is positioned with a manipulator 520, allowing the phase plate to be centered around the optical axis. The projection system forms a magnified image of the sample on a detector 524, thereby revealing sample details of e.g. 0.1 nm. The detector may take the form of a fluorescent screen, or e.g. a CCD camera. In the case of e.g. a fluorescent screen the screen can be viewed via the glass window 526.

To align the optical components on the axis the TEM comprises a large number of deflectors, schematically shown as 528-1-528-7, although other deflectors on other places may be included. Also the lenses of the different modules 506, 516 may be mechanically shifted/centered, and the position of the electron source 504 may be mechanically aligned as well. This results in a change of the position of the undiffracted beam in diffraction plane 514, and thus in its conjugate plane where the phase plate resides. A special case is where the contrast enhancement device itself is centered. Then as well the central structure must be protected by deflecting the central beam away from the axis.

It is noted that deflectors in a TEM are often relatively slow: they consist of electro-magnetic coils surrounded by iron yokes (which are part of, for example, magnetic lenses), as a result of which the maximum deflection frequency is low. The deflectors also show hysteresis due to the surrounding iron.

In the special case where a contrast enhancement device is centered, the person skilled in the art may contemplate to center a holder holding the device as shown in for example FIG. 4 by scanning a beam in one direction, and then scanning the beam in a perpendicular direction. A problem with that approach is that a time delay is introduced between deflection signal and beam deflection, and that it thus takes relatively long to center the holder. Also hysteresis may result in deflection errors. Therefore this is not a satisfying method.

An improved method of centering is to circle the beam inside the rim of the hole, and then expand the radius of the circle until the beam just touches the rim. If the rim is not concentric with the circle the amount of current transmitted through the hole (or alternatively intercepted by the holder) shows a modulation with a frequency equal to the frequency with which the beam rotates. Using this signal the rim of the hole can be made concentric with the beam by either a mechanical movement (for example using a motorized aperture mechanism) or can be centered by shifting the center of rotation. When the hole is perfectly centered, or almost perfectly, a small variation in the diameter of the circle with which the beam circles (by changing the excitation of the deflection signal) results in a completely transmitted or a completely intercepted signal. A resolution (centering) of approximately one beam diameter (typically between 1 and 10 nm) can be achieved.

The time delay mentioned before does not occur, as circling at a high frequency only results in a decrease of the deflection, to be solved by an increase of the amplitude of the deflection signal (or a lower rotation frequency).

It is noted that for a phase plate that requires one or more supports for a central structure, such as a Boersch phase plate, one or more short intercept periods occur when the beam circles inside the hole's rim as a result of the interception by the supports. These periods, however, only occupy a small fraction of the total rotation period, as the supports only occupy a small fraction of the circumference of the hole.

Figure 6:
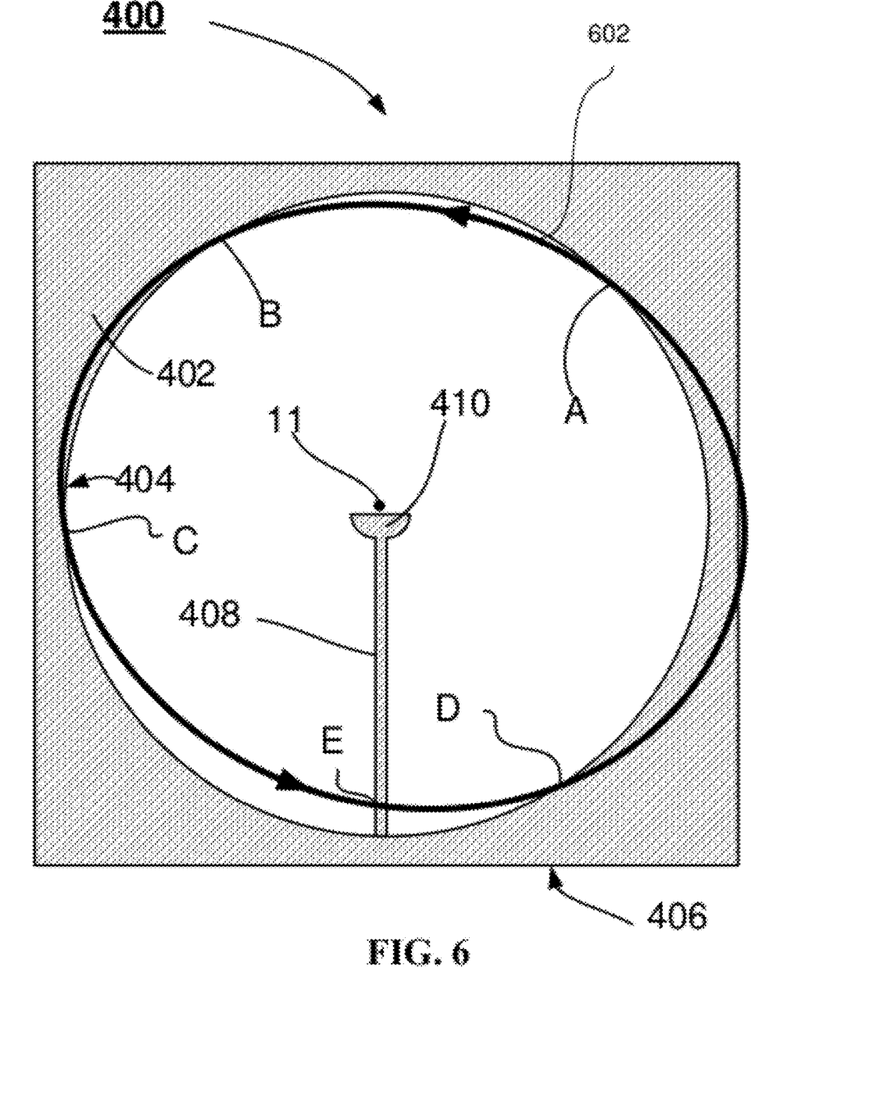
FIG. 6 is a schematic view of a method of centering.

FIG. 6 shows the phase enhancing device of FIG. 4, although other devices may be used. A beam is scanned over the device in a path 602. The amplitude of the scan signals is adjusted until the beam is intercepted by the holder twice per period. As already mentioned the path of the beam is preferably a circle, but in reality the path often shows a small ellipticity, which is shown here in an exaggerated way. As a result the beam is not intercepted by the holder 402 between the positions A and B, intercepted between positions B and C, not intercepted between positions C and D, and intercepted between positions D and A. In the orientation shown the stem 408 intercepts the beam for a very short period, but this is not the case for all orientations.

The beam can now be centered by centering the device or by adjusting the center of the path 602 using the symmetry of the periods AB versus CD and/or BC versus DA: when the beam is well centered the period AB should equal the period CD and the period BC should equal period DA.

This is repeated several times, until the path is highly circular and coincides with the rim 404. As the diameter of the beam of unscattered electrons is very small, typically in the range of 10-100 nm, the difference in diameter between a completely blocked beam and a completely transmitted beam is very abrupt, and a resolution of less than 100 nm is achievable.

It is noted that the first order error in the roundness of the hole and/or the circle with which the beam rotates, ellipticity, results in a modulation of twice the rotation frequency, and can thus be easily distinguished from the centricity signal.

The person skilled in the art will recognize that the proposed method can be adapted for use with other forms of the hole, such as a square hole. When the beam rotates in a circle with diameter d over a square hole with a diagonal S, with d between $S/\sqrt{2}$ and S, the beam is intercepted four times per revolution and transmitted four timer per revolution. Centering is achieved when the interception period are symmetric to each other and/or the transmission period are symmetric to each other.

It is, however, noted that this method is less sensitive than the method using a round hole, as a slight variation of the diameter with which the beam rotates will in general not result in a large variation in beam current, but rather in a small variation in beam current due to a small variation in duty cycle of the transmitted or intercepted beam current. Furthermore, a round hole has the advantage that the beam will expose the complete rim of the hole; any contamination and associated charging that results from this will have little impact on the beam (only monopole field, no higher order fields).

It is mentioned that instead of the inner rim of the hole also other, specially formed structures, such as separately formed arcs concentric with the hole, may be used.

It is further mentioned that not only a hole, but any structure resulting in a different transmission or reflection of electrons compared to the surrounding material, may be used. Examples of a different transmission are thin film of silicon, carbon, and the like, and examples of different reflection are e.g. gold on silicon, (more reflection) or oxides (more secondary emission).

It is noted that the above mentioned method can be used for centering the device, but also to determine the distance of the device from the axis (where it should be), followed by a command to a centering device resulting in a mechanical movement with a magnitude equal to the misalignment.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. The invention has broad applicability and can provide many benefits as described and shown in the examples above. The embodiments will vary greatly depending upon the specific application, and not every embodiment will provide all of the benefits and meet all of the objectives that are achievable by the invention.

It should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a non-transitory storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of non-transitory computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

The term "integrated circuit" refers to a set of electronic components and their interconnections (internal electrical circuit elements, collectively) that are patterned on the surface of a microchip. The term "semiconductor" or "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams.

In the present specification and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method for adjusting or aligning one or more optical elements in a Transmission Electron Microscope (TEM), the TEM equipped with an objective lens for guiding a beam of electrons to a sample and the TEM showing a diffraction plane in which at least a beam of unscattered electrons is focused, the TEM equipped with a structure to enhance the Contrast Transfer Function (CTF), said structure situated in the diffraction plane or an image thereof, the method comprising adjusting or aligning the optical elements, characterized in that irradiation with unscattered electrons of the structure during said adjusting or aligning is prevented by deflecting the beam of unscattered electrons away from the structure.

2. The method of claim 1 in which the structure is a phase plate or a single side band imaging device.

3. The method of claim 1 in which the structure is located round an optical axis, the beam is bent away from the optical axis to prevent irradiation of the structure, and the beam is bent back onto the axis and aligned to the axis using one or more deflectors and/or lenses.

4. The method of claim 1 in which the structure is part of or mounted on a holder, the position of the structure with respect to the holder known, and the structure centered by positioning one or more features of the holder.

5. The method of claim 4 in which the holder includes a circular hole, the center of the circular hole coinciding with the structure, and the feature is the rim of the circular hole.

6. The method of claim 4 in which the method further comprises determining the position of the structure with respect to the one or more features.

7. The method of claim 1 in which the diffraction plane coincides with the back-focal plane of the objective lens.

8. The method of claim 2 in which the structure is located round an optical axis, the beam is bent away from the optical axis to prevent irradiation of the structure, and the beam is bent back onto the axis and aligned to the axis using one or more deflectors and/or lenses.

9. The method of claim 2 in which the structure is part of or mounted on a holder, the position of the structure with respect to the holder known, and the structure centered by positioning one or more features of the holder.

10. The method of claim 3 in which the structure is part of or mounted on a holder, the position of the structure with respect to the holder known, and the structure centered by positioning one or more features of the holder.

11. The method of claim 9 in which the holder includes a circular hole, the center of the circular hole coinciding with the structure, and the feature is the rim of the circular hole.

12. The method of claim 10 in which the holder includes a circular hole, the center of the circular hole coinciding with the structure, and the feature is the rim of the circular hole.

13. The method of claim 9 in which the method further comprises determining the position of the structure with respect to the one or more features.

14. A method for adjusting or aligning one or more optical elements in a Transmission Electron Microscope comprising:
providing a TEM having an objective lens for guiding a beam of electrons to a sample, a diffraction plane in which at least a beam of unscattered electrons is focused, and a structure to enhance the Contrast Transfer Function, said structure situated in the diffraction plane or an image thereof;
adjusting or aligning the optical elements; and
preventing irradiation with unscattered electrons of the structure during said adjusting or aligning by deflecting the beam of unscattered electrons away from the structure.

15. The method of claim 14 in which the structure comprises a phase plate or a single side band imaging device.

16. The method of claim 14 in which the structure comprises being located around an optical axis, the beam being bent away from the optical axis to prevent irradiation of the structure, and the beam being bent back onto the axis and aligned to the axis using one or more deflectors and/or lenses.

17. The method of claim 14 in which the structure comprises part of or mounted on a holder, the position of the structure with respect to the holder known, and the structure centered by positioning one or more features of the holder.

18. The method of claim 17 in which the holder comprises a circular hole, the center of the circular hole coinciding with the structure, and said feature comprising the rim of the circular hole.

19. The method of claim 17 in which the method further comprises determining the position of the structure with respect to the one or more features.

20. The method of claim 14 in which the diffraction plane coincides with a back-focal plane of the objective lens.

* * * * *